United States Patent [19]

Landau et al.

[11] Patent Number: 4,592,800
[45] Date of Patent: Jun. 3, 1986

[54] METHOD OF INHIBITING CORROSION AFTER ALUMINUM ETCHING

[75] Inventors: Richard F. Landau, Londonderry; Henry A. Majewski, Nashua, both of N.H.

[73] Assignee: Oerlikon-Buhrle U.S.A. Inc., New York, N.Y.

[21] Appl. No.: 667,901

[22] Filed: Nov. 2, 1984

[51] Int. Cl.$^4$ .............. C23F 1/02; B44C 1/22; C03C 15/00; C03C 25/06
[52] U.S. Cl. ................... 156/643; 156/646; 156/656; 156/659.1; 156/665; 156/345; 204/192 E; 252/79.1; 427/88
[58] Field of Search ........... 156/643, 646, 656, 659.1, 156/665, 345; 427/38, 39, 88–90; 204/164, 192 EC, 192 E, 298; 252/79.1; 134/1, 31

[56] References Cited

U.S. PATENT DOCUMENTS 4,267,013  5/1981  Iida et al. ................ 252/79.1 X
4,351,696  9/1982  Radigan ................... 156/665 X Primary Examiner—William A. Powell
Attorney, Agent, or Firm—Schiller & Pandiscio

[57] ABSTRACT

A novel process for treating IC wafers or chips so as to inhibit corrosion after aluminum etching. The process involves passivating the wafers or chips by displacing reactive gaseous species adsorbed on the wafers or chips with a gaseous species that is substantially inert and hence will not corrode aluminum layers on the IC wafers or chips.

21 Claims, 7 Drawing Figures

IMAGED GLASS

METALLIZE

COAT PHOTORESIST

IMAGE PHOTORESIST

ETCH ALUMINUM

REMOVE PHOTORESIST

METHOD OF INHIBITING CORROSION AFTER ALUMINUM ETCHING

This invention relates to the fabrication of integrated circuit devices (IC devices) and other solid state semiconductor devices, and more particularly to a novel method of treating IC and other solid state semiconductor devices in the course of their manufacture for the purpose of inhibiting corrosion of aluminum after the latter has been subjected to plasma etching.

BACKGROUND OF THE INVENTION

Virtually every IC fabrication process contains an aluminum metallization step and an aluminum etching step. The aluminum serves as an interconnection layer for all of the devices on the substrate (commonly IC devices are formed on silicon or sapphire substrates which typically have a circular form and are called "wafers" or "chips"). The aluminum etching step is for the purpose of creating patterns in the aluminum layer according to a predetermined image. The aluminum layers are imaged by the use of resists which are processed to serve as etching masks. Aluminum can be imaged with positive or negative resists, but positive resists are generally preferred for better image dimensional control. An aluminum metallization layer may be etched by means of either wet or dry etchants. In recent years, plasma etching has been rapidly supplanting wet etching in IC production technology.

Unfortunately, the typical IC fabrication process is handicapped by the fact that the aluminum layers on the substrates are vulnerable to corrosion after undergoing plasma etching. The corrosion is a consequence of the materials used in plasma etching. Plasma etching of aluminum may be conducted with various materials. The most common plasma etching system for etching aluminum on silicon IC devices employs a mixture of $SiCl_4$ and $Cl_2$ gases, usually in the presence of an inert gas such as argon or helium. In a plasma etching step utilizing the foregoing mixture, $AlCl_3$ is commonly formed as a reaction product. $SiCl_4$, $Cl_2$ and $AlCl_3$ are all highly reactive in the presence of moisture, reacting with moisture to form highly corrosive HCl which will rapidly corrode aluminum, even at ambient temperatures and pressures. After a typical plasma etching of aluminum has occurred, at least a portion of one or more of the reactive gases $SiCl_4$, $Cl_2$, and $AlCl_3$ tends to be adsorbed on the surfaces of the chip or wafer. These reactive materials are adsorbed on all surfaces of the chip or wafer, i.e., they are adsorbed on all exposed surfaces of the substrate or of materials on the substrate, e.g., on surfaces of the aluminum or any residual resist, or any other coatings (such as glass or $SiO_2$), on the substrate.

In current high production IC fabrication processes, the wafers or chips being processed move continuously from one stage to another, and typically the wafers or chips are subjected to further processing relatively soon after aluminum etching has occurred. However, even relatively short exposure of the wafers to moisture in the surrounding environment will cause the adsorbed reactive gases to form HCl, and as a consequence, HCl corrosion of the aluminum layers on the wafers will occur at a very high rate. In such event, the corrosion may render the resulting devices on the wafers inoperative, or unacceptable, or unreliable.

OBJECTS AND SUMMARY OF INVENTION

The primary object of this invention is to provide a method of protecting metallization layers on IC devices from corrosion by reactive etching process materials adsorbed on the surfaces of the devices.

A further important object of the invention is to provide a method of processing semiconductor chips or wafers so as to inhibit corrosion of aluminum layers after the aluminum layers have undergone plasma etching.

Another object of this invention is to provide a dry anti-corrosion passivation treatment for IC wafers so as to protect them from corrosion after they have undergone plasma-etching of their aluminum metallization layers.

Still another object of the invention is to provide a quick and reliable method of removing adsorbed reactive gases from chips involved in the manufacture of IC devices after the chips have been subjected to plasma etching of aluminum layers, whereby to inhibit corrosion of the aluminum layers.

A further object of the invention is to provide a novel method of inhibiting corrosion of aluminum layers formed on chips used in the fabrication of IC devices, said method having the advantage that it may be integrated into a conventional IC fabrication process without requiring any substantial amounts of additional capital equipment or any substantial change in the fabrication process.

A further object of this invention is to provide a method of inhibiting the corrosion of aluminum on IC devices using normal plasma etching equipment.

A further object of the invention is to provide a method of inhibiting corrosion of aluminum from adsorbed reactive chlorine-containing gases in a manner which may be accomplished at ambient temperatures.

These and other objects are achieved by a novel process which involves subjecting IC wafers or chips to a dry anti-corrosion passivation treatment which involves replacing adsorbed reactive gases with a new adsorbed gaseous species that is substantially inert and hence will not corrode aluminum layers on the IC wafers or chips. The novel process involves replacing the reactive gaseous species adsorbed on the chip with a non-corrosive gaseous species having a higher molecular weight.

Other objects, features and advantages of the invention are set forth hereafter in the following detailed specification which is to be considered together with the accompanying drawings wherein:

FIGS. 1A–1F schematically illustrate a conventional aluminum etching sequence; and FIG. 2 illustrates conventional apparatus which may be used in practicing the present invention.

DETAILED DESCRIPTION OF THE INVENTION

Essentially the invention involves treating chips or wafers used in the formation of IC devices after they have undergone aluminum metallization and aluminum plasma etching, so as to (a) remove adsorbed corrosive gases, and (b) replace the adsorbed corrosive gases with a non-corrosive adsorbent, whereby to passivate the aluminum layers in a quick and easy manner. While it is conceivable that removal of some of the adsorbed corrosive gases may be effected before contacting the chips or wafers with the non-corrosive substitute adsorbent, such pre-treatment is not believed to be practical. Therefore according to this invention, passivation is achieved by using the non-corrosive adsorbent to displace the adsorbed corrosive gases. In any event the treatment provided by this invention is conducted so as not to interrupt the rapid processing of the IC devices after aluminum etching has occurred.

The present invention is based on the concept, previously utilized in chromatography, of replacing an adsorbed species with another species of a higher molecular weight. It is a general principal and phenomenon of chromatography that an adsorbed gaseous species will be readily replaced by a gaseous species which has a higher molecular weight. The present invention utilizes that phenomenon to remove adsorbed reactive gases from IC chips and replace them with one or more gaseous species which are inert with respect to aluminum and hence will not corrode the aluminum layers on the IC chips. An essential requirement of the invention is that the higher molecular weight gaseous species which replace the reactive adsorbed gaseous species must be a material which will not attack any photoresist remaining on the IC chip.

As a general matter, the invention involves exposing an IC chip immediately following the etching of aluminum to an atmosphere containing a gaseous species which (a) is chemically inert relative to the chip, its aluminum coating(s), and any resist which remains on the wafer, and (b) has a higher molecular weight than the adsorbed corrosive gases.

FIGS. 1A to 1F illustrate a typical aluminum etching sequence according to the prior art.

Figure 1A:
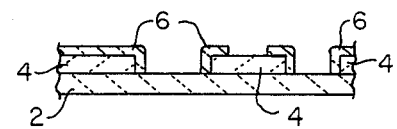
Figure 1B:
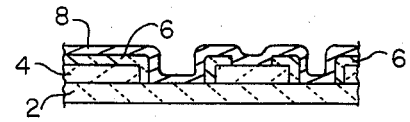

Referring to FIG. 1A, a silicon substrate or chip 2 has portions of one surface coated with islands 4 of $SiO_2$, and in turn portions of the $SiO_2$ islands 4 are coated with a glass 6. In FIG. 1B a layer 8 of aluminum has been deposited over the glass and the exposed silicon surfaces.

Figure 1C:
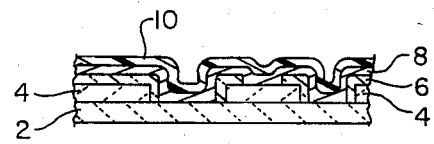
Figure 1D:
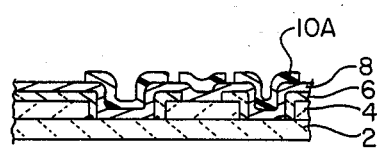

In FIG. 1C a photoresist 10 has been deposited over the aluminum layers. In FIG. 1D the photoresist has been imaged and developed, as a consequence of which some portions of the resist have been removed and other portions 10A of the resist remain.

Figure 1E:
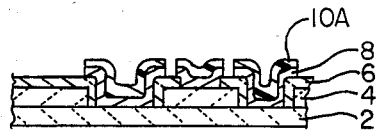
Figure 1F:
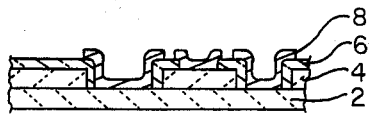

In FIG. 1E the exposed portions of the aluminum have been etched away. In FIG. 1F the photoresist has been removed, with the result that portions of glass layer 6 and aluminum layer 8 are exposed.

Assuming, for example, that the step of plasma etching the aluminum layer involved a gaseous environment comprising $SiCl_4$ and $Cl_2$ in an inert gas such as argon or helium, if subsequent processing of the substrate shown in FIG. 1F involves exposure to an atmosphere containing moisture (e.g., the substrates are exposed to the air of a laboratory "clean room"), the moisture will react with the adsorbed gaseous compounds consisting of or containing chlorine to form HCl, and the HCl will rapidly attack the aluminum. The same corrosion activity will occur even if photoresist 10 shown in FIG. 1E is retained on the device as it undergoes subsequent processing (although the extent of corrosion of the aluminum may be reduced if the aluminum is protected by an overcoating of residual resist).

According to this invention, after etching of the aluminum layer (which etching may occur several times if several metallization layers of aluminum are deposited) has been accomplished, the IC device is subjected to an atmosphere containing a selected substitute adsorbent gas at a temperature at which the substitute adsorbent gas will replace the reactive gases that have been adsorbed by the aluminum, the resist, or other portions of the IC chip. The period during which the IC chip is exposed to an atmosphere containing the substitute adsorbent gas will vary according to the temperature, the particular corrosive gaseous species adsorbed by the chip, and the particular adsorbent gas which is present in the atmosphere. However, in the usual case the displacement of adsorbed corrosive gases will occur within a period of thirty to ninety seconds.

Various etchant gaseous compositions are commonly used in plasma etching of aluminum. The most common composition consists of $SiCl_4$ and $Cl_2$, which as noted hereinabove commonly results in the formation of $AlCl_3$. The latter reacts quite readily with moisture to form HCl. Other gaseous compositions which have been used in plasma etching of aluminum are: $SCl_6$, $SiCl_4$, $BCl_3$ plus $Cl_2$, $BCl_3$, $CCl_4$, $CHCl_3$, and $C_2HCl_3$. Compounds of other halogens also may be used in plasma etching of aluminum or other metals, e.g., compounds of bromine and fluorine. Such other halogen compounds (and products formed by those compounds during the etching step) also tend to react with moisture to form an acid that is corrosive to aluminum. However, as a practical matter, chlorine compounds are used in plasma etching of aluminum or other metals in substantially more instances than compounds of bromine and fluorine, since the latter tend to result in less effective and controllable etching than chlorine compounds.

According to this invention, the substitute adsorbent gaseous species may be any of the following: $C_3F_8$, $C_3Cl_8$, $C_2Cl_4H_2$, $C_2Cl_6$, $C_2Cl_5H$, $CHBr_3$, $CH_2Br_2$, $SCl_6$, $C_2Cl_3F_3$, $B_6F_8$, $C_2Br_3H_3$ and $(C_3H_7)_3Si-O-Si(C_2H_5)_3$.

Of course, is contemplated that other organic compounds, e.g., higher homologs of some of the foregoing compounds, may be suitable for use as anti-corrosion passivating agents in the practice of this invention.

This invention may be practiced by means of a variety of conventional plasma etching equipment. One example of suitable equipment is the Model SWE654 Cassette-to-Cassette Single Wafer Etching System sold by Balzers AG of Balzers, Lichtenstein.

Figure 2:
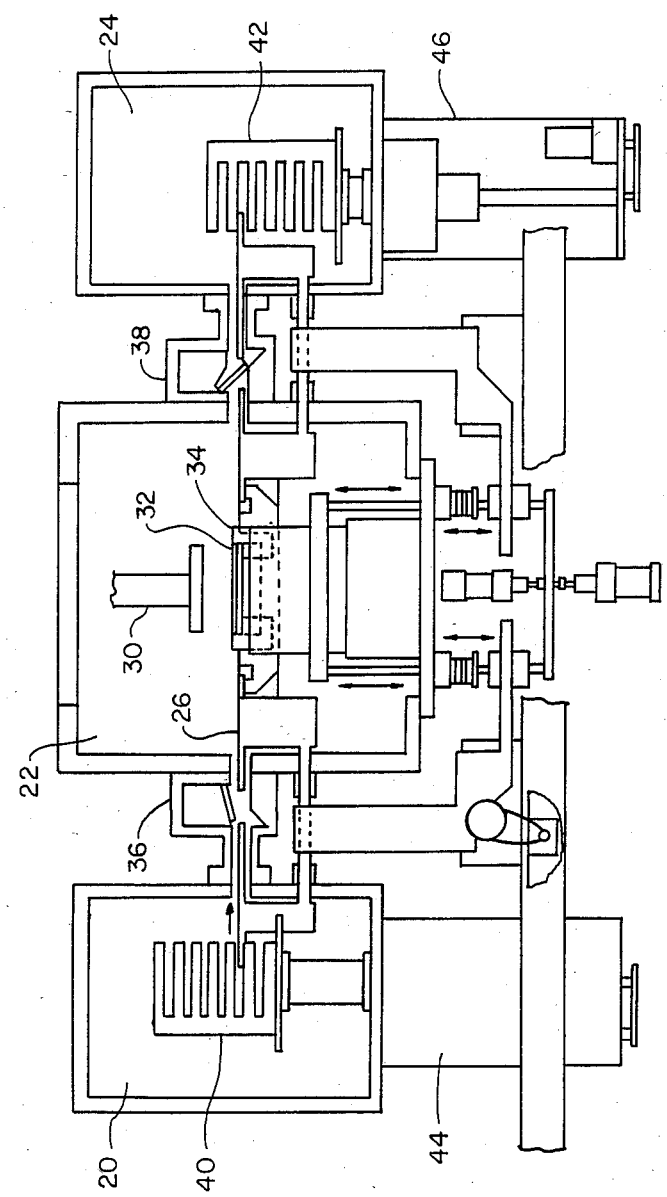

The Balzers Model SWE654 equipment is illustrated schematically in FIG. 2. It generally comprises a sender load lock chamber 20, a plasma etching process chamber 22, a receiver load lock chamber 24, and a walking transport beam conveyor system 26 for conveying wafers from sender load lock chamber 20 to the receiver load lock chamber 24 via process chamber 22. The process chamber 22 contains an upper electrode 30 and a lower electrode 32. The equipment also includes a clamp means 34 for releasably locking a wafer against the lower electrode. The load lock chambers 20 and 26 are connected to process chamber 22 by flapper valve chambers 36 and 38 that contain flapper valves (not shown) that automatically to allow wafer transport through the system. Load lock chamber 20 has a cassette means 40 for holding a selected number of wafers to be etched, e.g., 10 wafers. Load lock chamber 24 has a similar cassette means 42 for receiving a like number of wafers removed by the conveyor from process chamber 22, e.g., 10 wafers. The two load lock chambers have cassette elevators 44 and 46 for raising and lowering the cassette means in timed relation. Operation of the machine is controlled by an electronic programmer (not shown) that causes the machine to operate so that wafers are etched one at a time in process chamber 22.

In process chamber 22, aluminum on the wafers is subjected to plasma etching utilizing one of the etchant gas compositions described above, e.g., $SiCl_4$ and $Cl_2$. Although not shown, it is to be understood that means are provided for causing process chamber 22 to be at a reduced pressure during the plasma etching step. In a conventional setup, only inert gases such as nitrogen and/or argon are fed to and vented from the load lock chambers.

At the beginning of an etching operation, cassette means 40 is loaded with wafers to be etched while cassette means 42 contains no wafers, and cassette means 40 is in raised position while cassette means 42 is in lowered position. Thereafter, sequentially a wafer is fed by conveyor system 26 from cassette means 40 to process chamber 22 for etching, and then when etching has been completed the same wafer is delivered to cassette means 42. Each time conveyor 26 is operated it (a) feeds an etched wafer from process chamber 22 to cassette means 42 and (b) simultaneously feeds a new unetched wafer from cassette means 40 to process chamber 22. Each time such a cycle occurs, the elevators 44 and 46 lower and raise cassette means 40 and 42 respectively so as to (a) allow a wafer to be removed from cassette 40 by conveyor system 26 and (b) allow a wafer in process chamber 22 to be transported by conveyor system 26 to cassette means 42. The programmer for the machine causes the flapper valves (not shown) in valve chambers 36 and 38 to (a) open automatically so as to allow wafers to pass to and from the process chamber, and (b) close automatically when the transfer has been completed, whereupon the machine is set to conduct another etching operation. Although not shown, it is to be understood that load lock chambers 20 and 24 are adapted to be continuously purged with substantially pure nitrogen or argon to equalize the load lock pressure with that of process chamber 22, a necessary requirement for accomplishing transfer of wafers into and out of the process chamber. At the end of the process program the load lock chambers are vented and purged with nitrogen.

However, in the practice of the present invention, one or more selected corrosion-inhibiting gases are substituted for the reactive gases adsorbed on the wafers after the wafers are transported from process chamber 22 to the receiver load lock chamber 24. According to this invention, at least one selected corrosion-inhibiting gas is injected into the the load lock chamber 24 for a selected period of time calculated to allow the corrosion-inhibiting gas to displace the corrosively reactive gases adsorbed on the wafers. The corrosion-inhibiting gas or gases may be injected alone, but preferably they are injected together with an inert gas such as nitrogen or argon gas. Depending upon the particular gases employed, the load lock chamber 24 may or may not be heated above the ambient temperature.

It is to be noted that the corrosion-inhibiting gases may be injected into load lock chamber 24 each time a wafer is received from process chamber 22, or only after the cassette means 42 is fully loaded with wafers. Preferably, however, the corrosion-inhibiting gas is injected only after the cassette means 42 is fully loaded with wafers.

According to this invention, various materials may be used to passivate IC wafers or chips so as to prevent or inhibit corrosion of aluminum from adsorbed etchant materials. It is a requirement of this invention that the material which is used to inhibit corrosion be a material which (a) has a higher molecular weight than the adsorbed reactive species, (b) will not react with aluminum to cause corrosion (or will react with aluminum less rapidly than the adsorbed reactive species which it has displaced), (c) will react slowly or not at all with the semiconductor chip or with organic resist remaining on the chip, and (d) will not react or will react relatively slowly, with moisture to form a compound that will readily corrode aluminum or react with the semiconductor chip or any organic resist remaining on the chip. Additionally the corrosion-inhibiting material must be a material which will displace the adsorbed corrosive species at temperatures below about 220 degrees C., preferably at temperatures of between about 20 degrees C. and 220 degrees C.

The preferred corrosion-inhibiting gaseous material employed in the practice of this invention is $C_3F_8$. That particular gaseous species is preferred because it has little or no reactivity with aluminum in the presence of moisture, and additional it is non-reactive with silicon or with the typical organic resist materials which are employed in aluminum etching processes. A further advantage of using $C_3F_8$ is that it will substitute itself readily for the adsorbed reactive gases at ambient temperatures, e.g., 25 degrees C. In using $C_3F_8$, the temperature of the stage at which the substitution of the gaseous species occurs, e.g., the temperature in lock chamber 24, may be between about 20 degrees C. and 220 degrees C., but preferably it is between 70 and 200 degrees C. The 220 degrees C. temperature is the upper limit due to the fact that above that temperature any photoresist on the wafer will tend to decompose or pyrolyze. At 100 degrees C., using $C_3F_8$, the exchange is very fast, typically taking no longer than 30 to 60 seconds to completely remove $SiCl_4$, $Cl_2$ and $AlCl_3$ and replace those species with $C_3F_8$.

Of course $C_3F_8$ also may be used to passivate aluminum-bearing substrates that have undergone plasma etching with other halogen etchant materials. The only requirement is that the adsorbed reactive gases which are to be purged from the substrates must have a lower molecular weight than $C_3F_8$.

The other materials listed above which may be used in place of $C_3F_8$ differ somewhat in the rate at which they will replace the reacted gases adsorbed on the substrate. However, in general they may be used to displace adsorbed reacted gases and to passivate the aluminum etched wafers at temperatures in the range of from about 20 degrees C. to 220 degrees C. As with $C_3F_8$, these other passivating materials must have a lower molecular weight than the adsorbed reactive species which are to be displaced.

Of course, it is not necessary that the process be carried out in apparatus as shown in FIG. 2. The process may be carried out in a variety of equipment and wafers may be dry passivated according to this process either in batches as described above or singly.

Following is a specific example of how to carry out the present invention.

EXAMPLE

A plurality of silicon substrates metallized with aluminum were inserted one after the other into a plasma etching process chamber, similar to the one shown at 22 in FIG. 2, and maintained there in an atmosphere of $SiCl_4$, $Cl_2$ and helium under a pressure of about 0.5 to about 1.5 Torr for approximately 45 seconds while the electrodes 30 and 32 were coupled to a 13.56 MHz RF power supply operating at about 100 to 250 watts. The electrodes in the etching process chamber 22 had a spacing of about 7–14 millimeters and etching was conducted at a rate of about 12,000 angstrom units per minute. After etching had been completed, each substrate was transferred to a load lock receiving chamber such as shown at 24 in FIG. 2 where it was contacted with $C_3F_8$ for a selected period of time under selected pressure and temperature conditions. The different substrates were subjected to passivation under different operating conditions as set forth in the following table, with the passivating gas being continuously circulated through the load lock receiving chamber during the time that the substrate was present therein so as to effect removal from the load lock receiving chamber of the reactive species which are displaced by the passivating atmosphere. After the period of time selected for the passivation had elapsed, the substrates were removed from the receiving load lock chamber and exposed to moisture-containing air at a temperature of about 25 degrees C. and atmospheric pressure. After several hours of exposure to the moisture-laden air, it was determined that none of the aluminum films on plurality of substrates had undergone any corrosion.

The following table illustrates the different operating conditions which were utilized in the load lock receiving chamber 24 for passivating the substrates with $C_3F_8$ according to the foregoing example.

TABLE 1

| Time (sec) | Pressure (Torr) | Temperature (Deg. C.) | Flow (Sccm) |
|---|---|---|---|
| 10 | 20 | 20 | 500 |
| 10 | 3 | 100 | 200 |
| 60 | 3 | 20 | 186 |
| 30 | 6 | 20 | 450 |
| 60 | 2 | 20 | 160 |
| 60 | 2.5 | | 175 |

It is to be noted that similar results may be obtained using $C_3F_8$ as the passivating material where the wafers or substrate have been plasma etched using other etchant compositions noted above, provided, however, that the adsorbed reactive species must have smaller molecular weights than $C_3F_8$.

Additional experiments employing the same conditions set forth in the foregoing Table 1 have been conducted using the gases set forth in the following table for anti-corrosion passivation of wafer surfaces after aluminum etching employing $SiCl_4$ and $Cl_2$.

TABLE 2

| | |
|---|---|
| 1. | $C_3Cl_8$ |
| 2. | $C_2Cl_6$ |
| 3. | $C_2Cl_5H$ |
| 4. | $C_2Cl_4H_2$ |
| 5. | $CHBr_3$ |
| 6. | $CH_2Br_2$ |
| 7. | $SCl_6$ |
| 8. | $C_2Cl_3F_3$ |
| 9. | $B_6F_8$ |
| 10. | $(C_3H_7)_3Si-O-Si(C_2H_5)_3$ |

In these additional experiments each of the gases in Table 2 was used by itself to passivate the aluminum films of silicon subtrates. The aluminum films passivated using the foregoing gases under the conditions set forth in the Table 1 exhibited no corrosion after being exposed to moisture-laden air for several hours at about 25 degrees C. and atmospheric pressure.

It is to be noted that similar results will be obtained with the foregoing alternative passivation materials if the wafers or substrate are etched using other etchant compositions noted above. Of course, the choice of passivating gas must comply with the requirement that the passivating gas have a higher molecular weight than the adsorbed reactive species which are to be displaced from the substrates.

Although it is preferred that the passivating gases be used undiluted, they may be used in admixture with an inert gas such as helium or argon, or with a gas such as nitrogen.

It also is contemplated that a mixture of two or more of the foregoing passivating gases may be used in the practice of this invention.

As used herein, the term "chips", "wafers" and "substrates" are intended to be synonymous with one another. Moreover, those terms are intended to cover chips, wafers and substrates in their original form or after they have been subjected to one or more processing steps in the fabrication of IC devices.

What is claimed is:

1. In the fabrication of IC or other solid state semiconductor devices comprising (1) aluminum metallization and (2) plasma etching of aluminum involving use or formation of one or more of $SiCl_4$, $Cl_2$, and $AlCl_3$ and adsorption of one or more of said $SiCl_4$, $Cl_2$, and $AlCl_3$ species on surfaces of said devices or surfaces of substrates used in the fabrication of said devices, a process for inhibiting corrosion of aluminum layers formed by said metallization comprising: (a) exposing said devices or substrates to a gaseous non-plasma atmosphere comprising at least one substance that has a higher molecular weight than the adsorbed species of $SiCl_4$, $Cl_2$, and $AlCl_3$ and is non-reactive with aluminum in the presence of moisture, (b) continuing said exposure for a time and at a temperature sufficient to permit said at least one substance to displace substantially all of said adsorbed species, and (c) removing the said displaced species from contact with said devices or substrates.

2. Method according to claim 1 wherein said at least one substance is an organic compound.

3. Method according to claim 1 wherein said at least one substance is substantially inert relative to said device or substrate.

4. Method according to claim 1 wherein said at least one substance is capable of displacing said adsorbed species at temperatures in the range of about 20 degrees C. to about 220 degrees C.

5. A process according to claim 1 wherein said at least one substance is a member of the group consisting of $C_3F_8$, $C_3Cl_8$, $C_2Cl_6$, $C_2Cl_5H$, $C_2Cl_4H_2$, $CHBr_3$, $CH_2Br_2$, $SCl_6$, $C_2Cl_3F_3$, $B_6F_8$, $C_2Br_3H_3$ and $(C_3H_7)_3Si-O-Si(C_2H_5)_3$.

6. Method according to claim 5 wherein said at least one substance is capable of displacing said adsorbed species at a temperature of betweeen about 20 degrees C. and about 220 degrees C.

7. Method according to claim 5 wherein said at least one substance is capable of substantially fully displacing said adsorbed species at about room temperature, i.e, at about 25 degrees C.

8. Method according to claim 5 wherein said at least one substance is $C_3F_8$ and said device or substrate is exposed to said atmosphere at between about 70 degrees C. and about 200 degrees C. for a period of between about 35 seconds to about 120 seconds.

9. Method according to claim 1 wherein said devices or substrates are exposed to said atmosphere immediately after said devices or substrates are subjected to aluminum etching.

10. In a method of producing an integrated circuit or other semiconductor device involving the deposition of one or more aluminum layers followed by plasma etching of said one or more aluminum layers in a process chamber featuring (a) the use of formation of at least one gaseous species comprising chlorine atoms and (b) adsorption of said gaseous species on one or more surfaces of said device, the improvement comprising contacting said device with a selected non-ionized gas comprising a substance that has a higher molecular weight than said at least one gaseous species under a temperature and for a time which will permit said substance to displace substantially all of the said at least one gaseous species adsorbed on or by said device.

11. Method according to claim 10 wherein the etching performed in said process chamber involves use of at least $SiCl_4$, and further wherein said device is contacted with a gaseous environment comprising an organic halogen compound that will not react with moisture, aluminum or an organic photoresist.

12. Method according to claim 10 wherein prior to said etching (a) said device is coated with a photoresist and (b) said photoresist is imaged and developed.

13. Method according to claim 12 wherein at least a portion of said device is covered by photoresist when said device is contacted by said selected gas.

14. Method according to claim 10 wherein said substance is an organic halogen compound.

15. Method according to claim 10 wherein said substance is an organic halogen compound that is gaseous at normal pressure and a temperature of between about 20 degrees C. and about 220 degrees C.

16. Method according to claim 10 wherein said substance is a member of the class consisting of $C_3F_8$, $C_3Cl_8$, $C_2Cl_6$, $C_2Cl_5H$, $C_2Cl_4H_2$, $CHBr_3$, $CH_2Br_2$, $SCl_6$, $C_2Cl_3F_3$, $B_6F_8$, $C_2Br_3H_3$, and $(C_3H_7)_3Si$-$O$-$Si(C_2H_5)_3$.

17. A method for inhibiting corrosion of an aluminum-containing film which has been etched utilizing a chlorinated plasma comprising:
(a) contacting the etched film with a non-plasma gas comprising at least one substance that (1) has a higher molecular weight than any species from the group consisting of $SiCl_4$, $Cl_2$, and $AlCl_3$ adsorbed by said film and (2) is non-reactive with aluminum in the presence of moisture;
(b) continuing said contact for a time and at a temperature sufficient to permit said at least one substance to displace substantially all of any species from the group consisting of $SiCl_4$, $Cl_2$ and $AlCl_3$ adsorbed by said film; and
(c) removing the said displaced species from contact with said film.

18. Method according to claim 18 wherein said at least one substance is capable of displacing said adsorbed species at temperatures in the range of about 20 degrees C. to about 220 degrees C.

19. A process according to claim 17 wherein said at least one substance is a member of the group consisting of $C_3F_8$, $C_3Cl_8$, $C_2Cl_6$, $C_2Cl_5H$, $C_2Cl_4H_2$, $CHBr_3$, $CH_2Br_2$, $SCl_6$, $C_2Cl_3F_3$, $B_6F_8$, $C_2Br_3H_3$ and $(C_3H_7)_3Si$-$O$-$Si(C_2H_5)_3$.

20. Method according to claim 18 wherein said film is part of a selected semiconductor device or substrate, and further wherein at least a portion of said device or substrate is covered by a photoresist when said film is contacted by said non-plasma gas.

21. Method according to claim 17 wherein said film is contacted with said non-plasma gas in a selected chamber, and removal of the displaced species from contact with said film is accomplished by circulating said non-plasma gas through said chamber.

* * * * *

UNITED STATES PATENT AND TRADEMARK OFFICE
CERTIFICATE OF CORRECTION

PATENT NO. : 4592800

DATED : June 3, 1986

INVENTOR(S) : Richard F. Landau et al

It is certified that error appears in the above-identified patent and that said Letters Patent is hereby corrected as shown below:

Claim 18, column 10, line 19, the number "18" should be changed to -- 17 --.

Signed and Sealed this

Second Day of September 1986

[SEAL]

Attest:

Attesting Officer

DONALD J. QUIGG

Commissioner of Patents and Trademarks